(12) United States Patent
Kim

(10) Patent No.: US 7,554,876 B2
(45) Date of Patent: Jun. 30, 2009

(54) SEMICONDUCTOR MEMORY DEVICE

(75) Inventor: Dong-Keun Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 180 days.

(21) Appl. No.: 11/819,565

(22) Filed: Jun. 28, 2007

(65) Prior Publication Data

US 2008/0212393 A1  Sep. 4, 2008

(30) Foreign Application Priority Data

Mar. 30, 2007  (KR) .................. 10-2007-0031981

(51) Int. Cl.
G11C 8/00 (2006.01)

(52) U.S. Cl. .................. 365/230.06; 365/230.08

(58) Field of Classification Search .......... 365/230.06, 365/230.08

See application file for complete search history.

(56) References Cited

U.S. PATENT DOCUMENTS

| | | | | | |
|---|---|---|---|---|---|
| 5,815,459 A | * | 9/1998 | Park et al. | ............... | 365/189.15 |
| 6,009,038 A | * | 12/1999 | Koshizuka | ............. | 365/230.08 |
| 6,345,012 B1 | * | 2/2002 | Casper | .................. | 365/230.08 |
| 6,747,909 B2 | * | 6/2004 | Kang | .................... | 365/230.06 |

FOREIGN PATENT DOCUMENTS

| KR | 10-2006-0087988 | 8/2006 |
|---|---|---|
| KR | 10-2007-0031776 | 3/2007 |

OTHER PUBLICATIONS

Korean Notice of Allowance issued in Korean Patent Application No. 10-2007-0031981 dated Nov. 14, 2008.

* cited by examiner

*Primary Examiner*—Anh Phung
(74) *Attorney, Agent, or Firm*—Mannava & Kang, P.C.

(57) ABSTRACT

A semiconductor memory device can effectively select a word line. The semiconductor memory device includes a word line driver unit for including N unit driving circuits for driving N word lines of a cell block, the N unit driving circuits being divided into M group driving circuits; a common address latch unit for latching a first address for selecting one of the M group driving circuits of the word line driver unit, and outputting the latched first address to the word line driver unit; and an address latch unit for latching a second address for selecting a unit driving circuit of the selected group driving circuit in the word line driver unit, and outputting a latched second address to the word line driver unit.

13 Claims, 7 Drawing Sheets

180

SEMICONDUCTOR MEMORY DEVICE

CROSS-REFERENCE TO RELATED APPLICATIONS

The present invention claims priority of Korean patent application no. 10-2007-0031981, filed in the Korean Patent Office on Mar. 30, 2007, which is incorporated by reference in its entirety.

BACKGROUND OF THE INVENTION

The present invention relates to a semiconductor memory device, and more particularly, to an address transfer circuit of a semiconductor memory device.

In a multi-functional system with a plurality of semiconductor devices, a semiconductor memory device serves as a data storage. The semiconductor memory device outputs data corresponding to an address inputted from a data processor, i.e., a central processing unit (CPU), to another device requesting the data, or stores data transferred from the data processor in unit cells corresponding to an address inputted together with the data.

The operations of the semiconductor memory device include an active operation, a write operation, and a read operation. In the active operation, the semiconductor memory device receives a row address and becomes an active state. Specifically, in the active operation, a word line corresponding to the row address is activated, and data signals of cells corresponding to the activated word line are amplified. In the write operation, data inputted together with a column address are stored in cells corresponding to the column address in response to a write command. In the read operation, data of cells corresponding to an external column address are outputted in response to a read command.

The semiconductor memory device includes a plurality of banks, each of which has a plurality of unit cell groups. A row decoder for decoding a row address and a column decoder for decoding a column address are provided at each bank. The row decoder decodes an inputted row address and selects and activates one of a plurality of word lines provided in the bank.

The unit cells of one bank are grouped into a plurality of cell blocks. A plurality of cell block control units and a plurality of latch units are provided in the bank. The cell block control units control the corresponding cell blocks, and the latch units latch the decoded address signals outputted from the row decoder and transfers the latched address signals to the cell blocks.

As the semiconductor device is highly integrated, the bit number of the row address increases and thus the row decoder becomes more complicated.

SUMMARY OF THE INVENTION

Embodiments of the present invention are directed to providing a semiconductor memory device that can effectively select a word line.

In accordance with an aspect of the present invention, a semiconductor memory device includes a first word line driver unit for including N unit driving circuits for driving N word lines of a first cell block, the N unit driving circuits being divided into M group driving circuits; a second word line driver unit for including N unit driving circuits for driving N word lines of a second cell block, the N unit driving circuits being divided into M group driving circuits; a common address latch unit for latching a first address for selecting one of the M group driving circuits included in the first or second word line driver units, respectively, and outputting the latched first address to the first or second word line driver unit; a first address latch unit for latching a second address for selecting a unit driving circuit of the selected group driving circuit in the first word line driver unit, and outputting the latched second address to the first word line driver unit; and a second address latch unit for latching the second address for selecting a unit driving circuit of the selected group driving circuit in the second word line driver unit, and outputting the latched second address to the second word line driver unit.

In accordance with another aspect of the present invention, a semiconductor memory device includes a word line driver unit for including N unit driving circuits for driving N word lines of a cell block, the N unit driving circuits being divided into M group driving circuits; a common address latch unit for latching a first address for selecting one of the M group driving circuits of the word line driver unit, and outputting the latched first address to the word line driver unit; and an address latch unit for latching a second address for selecting a unit driving circuit of the selected group driving circuit in the word line driver unit, and outputting a latched second address to the word line driver unit.

DESCRIPTION OF SPECIFIC EMBODIMENTS

Figure 1:
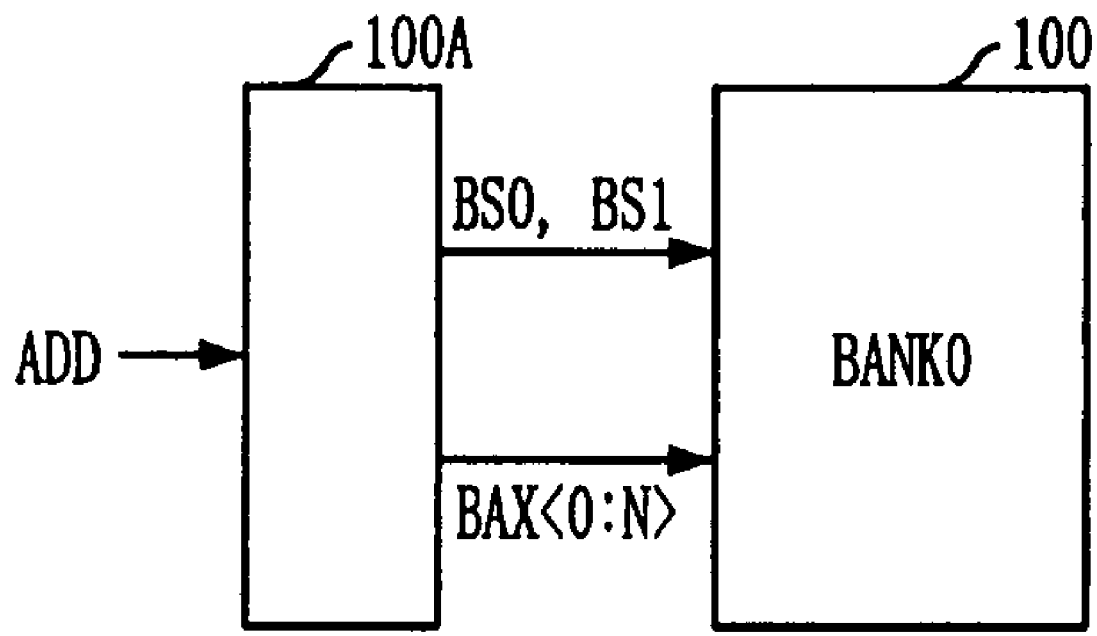
FIG. 1 is a block diagram of a semiconductor memory device.

FIG. 1 is a block diagram of a semiconductor memory device.

Referring to FIG. 1, the semiconductor memory device includes a bank 100 and a row decoder 100A. The row decoder 100A decodes an inputted row address ADD to generate a plurality of cell block select signals BS0 and BS1 and a plurality of local address signals BAX<0:N>.

Figure 2:
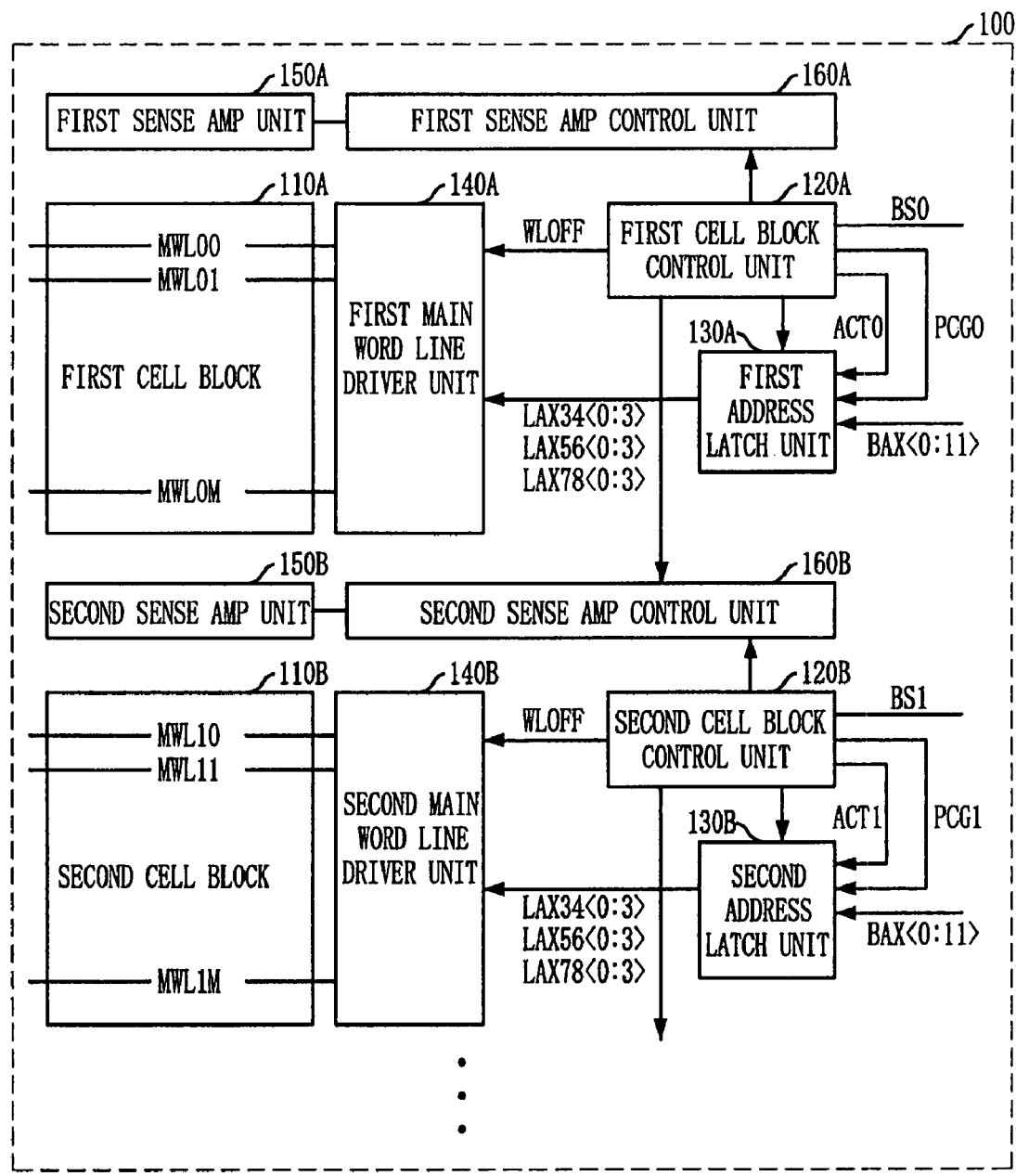
FIG. 2 is a block diagram of a bank illustrated in FIG. 1.

FIG. 2 is a block diagram of the bank 100 illustrated in FIG. 1.

Referring to FIG. 2, the bank 100 includes a plurality of cell blocks 110A and 110B, a plurality of cell block control units 120A and 120B, a plurality of address latch units 130A and 130B, a plurality of main word line driver units 140A and 140B, a plurality of sense amp units 150A and 150B, and a plurality of sense amp control units 160A and 160B. The cell block, e.g., 110A, includes a plurality of unit cells and a plurality of word lines MWL00 to MWL0M corresponding to the unit cells. It will be assumed herein that a 12-bit local address is inputted to the bank. The first cell block control unit 120A receives the cell block select signal BS0 to generate an active signal ACT0, a precharge signal PCG0, and a word line selection/activation signal WL0FF and controls the operation of the first sense amp control unit 160A. The first address latch unit 130A is activated in response to the active signal ACT0 and the precharge signal PCG0 and latches the local address BAX<0:11> to generate latched local addresses LAX34<0:3>, LAX56<0:3> and LAX78<0:3>. The first main word line driver unit 140A is activated in response to the word line selection/activation signal WL0FF and receives the latched local addresses LAX34<0:3>, LAX56<0:3> and LAX78<0:3> to select and activate one of the word lines MWL00 to MWL0M provided in the first cell block 110A. Data stored in the unit cell corresponding to the activated word line is transferred to the first sense amp unit 150A. The first sense amp unit 150A includes a plurality of bit line sense amps for sensing and amplifying the data signal provided from the first cell block 110A. Under the control of the first cell block control unit 120A, the first sense amp control unit 160A controls the operation of the first sense amp unit 150A.

Figure 3:
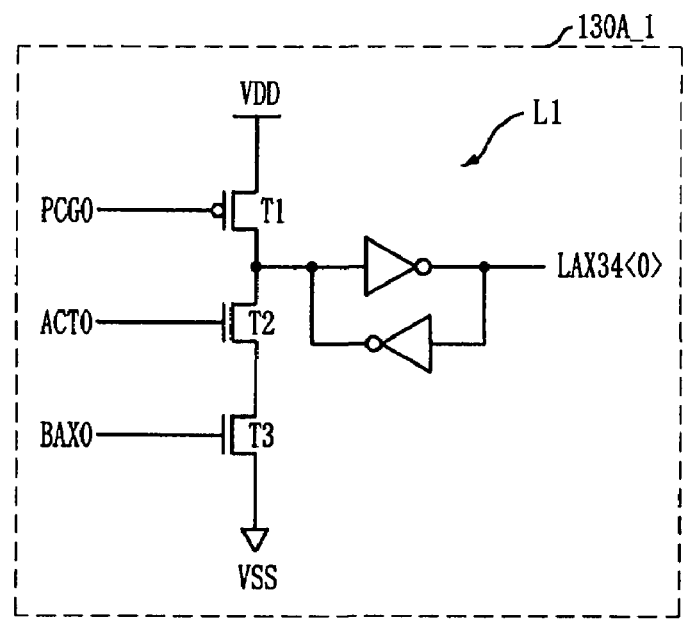
FIG. 3 is a circuit diagram of a unit latch provided in a first address latch unit illustrated in FIG. 2.

FIG. 3 is a circuit diagram of a unit latch provided in the first address latch unit 130A illustrated in FIG. 2.

Referring to FIG. 3, the unit latch 130A_1 includes MOS transistors T1, T2 and T3 and a latch L1. The MOS transistors T1, T2 and T3 have gates receiving the precharge signal PCG0, the active signal ACT0, and the local address signal BAX0, respectively.

Figure 4:
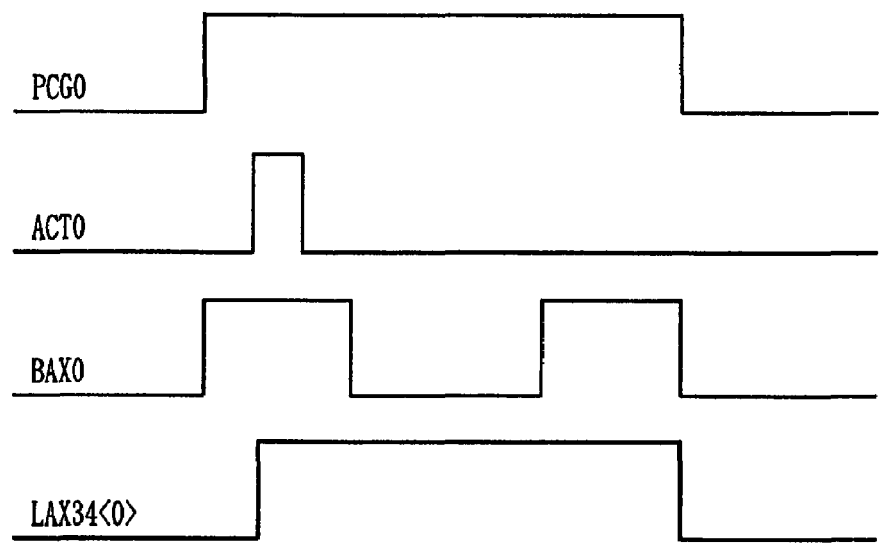
FIG. 4 is a timing diagram illustrating the operation of the unit latch illustrated in FIG. 3.

FIG. 4 is a timing diagram illustrating the operation of the unit latch 130A_1 illustrated in FIG. 3.

Referring to FIG. 4, when the local address signal LAX0 of a high level is inputted in such a state that both the precharge signal PCG0 and the active signal ACT0 are at a high level, a high level signal latched in the latch L1 is outputted as the local address signal LAX34<0>.

Figure 5:
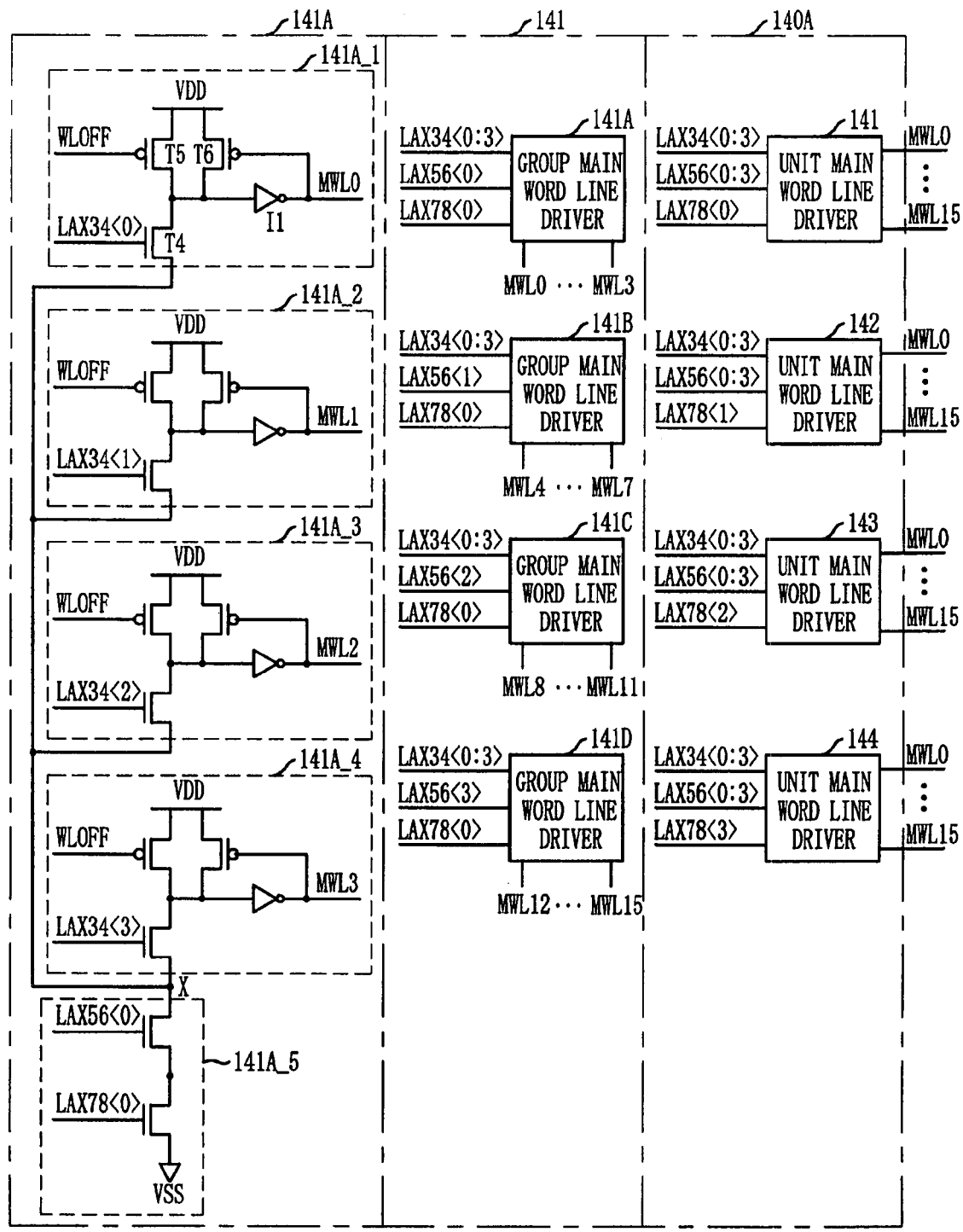
FIG. 5 is a block diagram of a first main word line driver illustrated in FIG. 3.

FIG. 5 is a block diagram of the first main word line driver unit 140A illustrated in FIG. 2.

Referring to FIG. 5, the first main word line driver unit 140A includes a plurality of group main word line drivers 141 to 144. Each of the group main word line drivers outputs sixteen word line activating signals MWL0 to MWL15 and includes four unit main word line drivers 141A to 141D. The four unit word line drivers are commonly connected to a common node X. Each of the four unit main word line drivers drives a corresponding word line in response to one of the latched local address signals LAX34<0:3>.

The unit main word line driver 141A includes four unit drivers 141A_1 to 141A_4 and a common activation unit 141A_5. The common activation unit 141A_5 enables the unit main word line drivers 141A_1 to 141A_4 in response to the latched local address signals LAX56<0> and LAX78<0>. The unit driver 141A_1 includes MOS transistors T4, T5 and T6, and an inverter I1. The MOS transistor T5 is activated in response to the word line selection/activation signal WL0FF. The MOS transistor T4 is activated in response to the latched local address signal LAX34<0>. The inverter I1 is connected a common node of the transistors T5 and T4. The MOS transistor T6 receives an output of the inverter I1 to latch an output signal of the inverter I1 at a high level.

In the semiconductor memory device of FIG. 2, one address latch unit is provided at each cell block. Accordingly, as the number of the cell blocks increases, more address latch units are required. In addition, each of the address latch unit must be provided with the latch units of FIG. 3 as many as bits of the local address.

In other words, as the semiconductor memory device is highly integrated, more cell blocks are provided in one bank and thus more address latch units must be provided. Hence, the increase in the number of the address latch units will require a wider circuit area, which is an obstacle to high integration of the semiconductor memory device.

Therefore, the present invention provides a semiconductor memory device that can effectively latch a local address signal and transfer the latched local address signal to a main word line driver unit.

Figure 6:
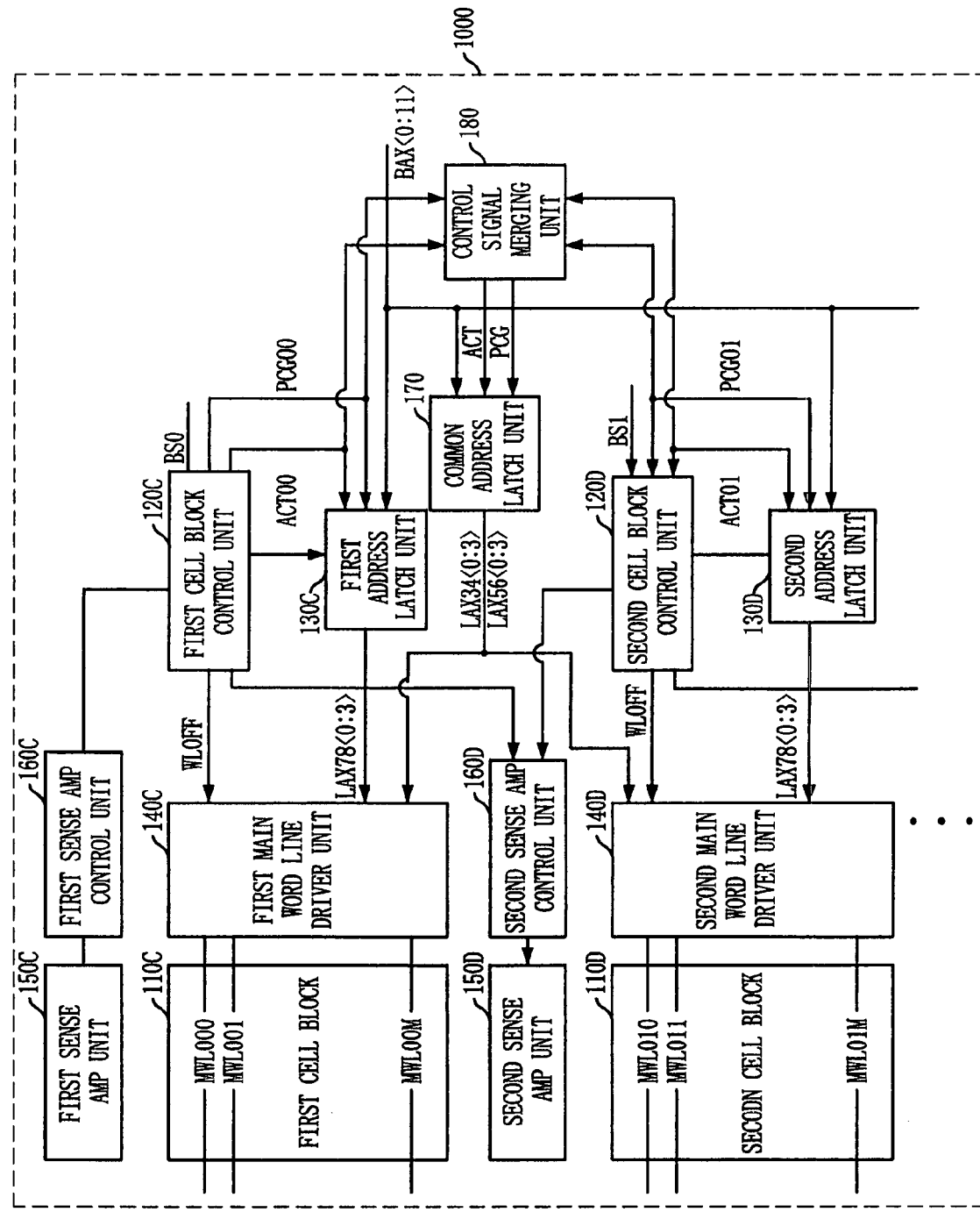
FIG. 6 is a block diagram of a semiconductor memory device in accordance with an embodiment of the present invention.

FIG. 6 is a block diagram of a semiconductor memory device in accordance with an embodiment of the present invention.

Referring to FIG. 6, a bank 1000 of the semiconductor memory device includes a plurality of cell blocks 110C and 110D, a plurality of cell block control units 120C and 120D, a plurality of address latch units 130C and 130D, a plurality of main word line driver units 140C and 140D, a plurality of sense amp units 150C and 150D, a plurality of sense amp control units 160C and 160D, a common address latch unit 170, and a control signal merging unit 180. The cell blocks 110C and 110D, the cell block control units 120C and 120D, the main word line driver units 140C and 140D, the sense amp units 150C and 150D, the sense amp control units 160C and 160D have the substantially same structure as those of FIG. 2.

The cell block, e.g., the first cell block 110C, includes a plurality of unit cells and a plurality of word lines MWL000 to MWL00M corresponding to the unit cells. The first cell block control unit 120C receives a cell block select signal BS0 to generate an active signal ACT00, a precharge signal PCG00, and a word line selection/activation signal WL0FF and controls the operation of the first sense amp control unit 160C. The first address latch unit 130C is activated in response to the active signal ACT00 and the precharge signal PCG00 and latches a local address BAX<0:N> to generate latched local addresses LAX34<0:3> and LAX56<0:3>. The common address latch unit 170 latches the local addresses BAX<0:N> to generate latched local addresses LAX78<0:3>. The first main word line driver unit 140C is activated in response to the word line selection/activation signal WL0FF, receives the latched local addresses LAX34<0:3>, LAX56<0:3> and LAX78<0:3> from the first address latch unit 130C and the common address latch unit 170 to select and activate one of the word lines MWL000 to MWL00M of the first cell block 110C. Data in a unit cell corresponding to the activated word line is transferred to the first and second sense amp units 150C and 150D. The first sense amp unit 150C includes a plurality of bit line sense amps to sense and amplify data signals provided from the corresponding cell block. Under the control of the first cell block control unit 120C, the first sense amp control unit 160C controls the operation of the first sense amp unit 150C. The control signal merging unit 180 receives the active signal ACT00 and the precharge signal PCG00 from the first cell block control unit 120C and an active signal ACT01 and a precharge signal PCG01 from the second cell block control unit 120D to generate a common active signal ACT and a common precharge signal PCG.

Figure 7:
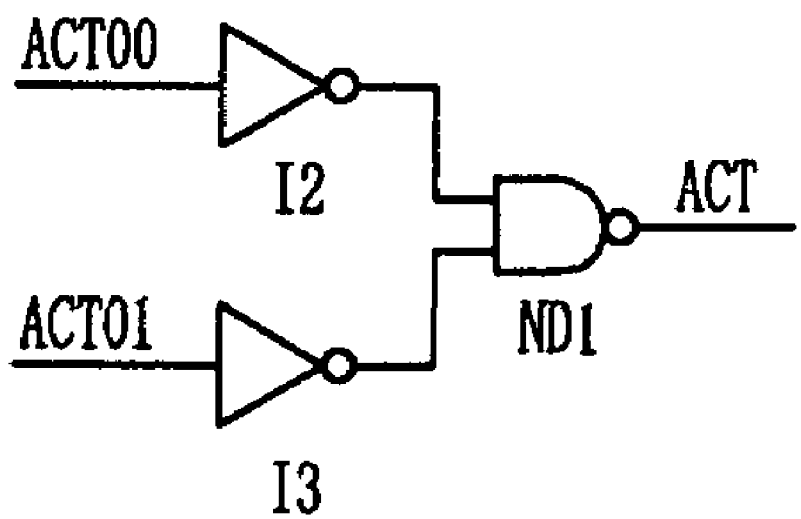
FIG. 7 is a circuit diagram of a control signal merging unit illustrated in FIG. 6.
Figure 7:
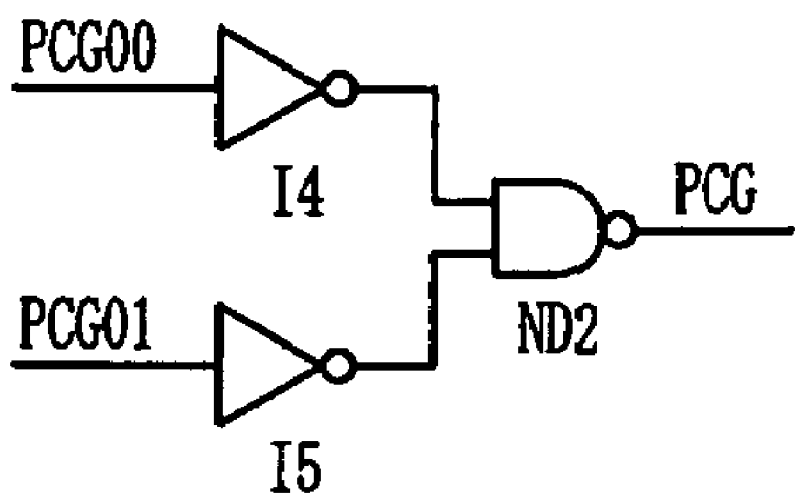

FIG. 7 is a circuit diagram of the control signal merging unit 180 illustrated in FIG. 5.

Referring to FIG. 7, the control signal merging unit 180 includes inverters I2 and I3 and a NAND gate ND1. The inverter I2 receives the active signal ACT00 from the first cell block control unit 120C, and the inverter I3 receives the active signal ACT01 from the second cell block control unit 120D. The NAND gate ND1 receives output signals of the inverters I2 and I3 to output the common active signal ACT. In addition, the control signal merging unit 180 includes inverters I4 and I5 and a NAND gate ND2. The inverter I4 receives the precharge signal PCG00 from the first cell block control unit 120C, and the inverter I5 receives the precharge signal PCG01 from the second cell block control unit 120D. The NAND gate ND2 receives output signals of the inverters I4 and I5 to output the common precharge signal PCG.

Figure 8:
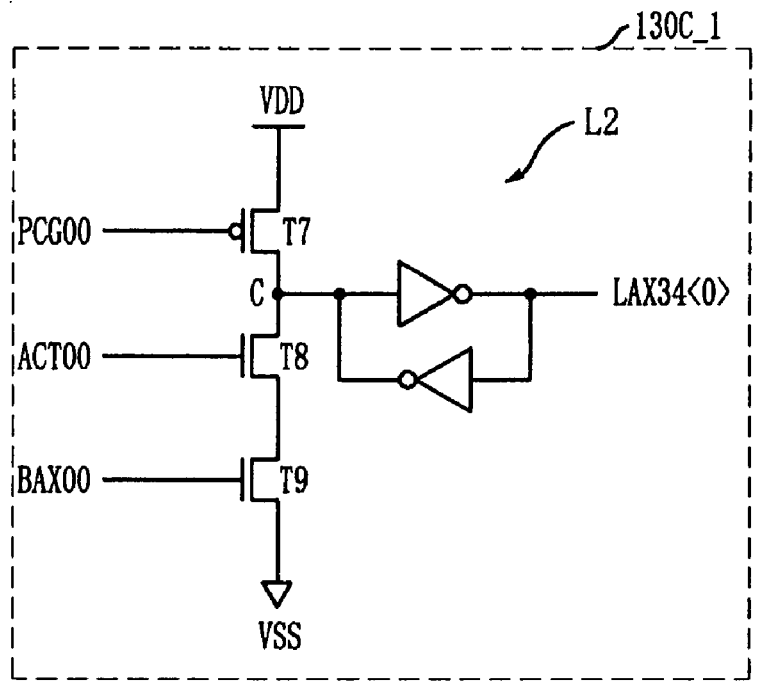
FIG. 8 is a circuit diagram of a unit latch provided in a first address latch unit illustrated in FIG. 6.

FIG. 8 is a circuit diagram of an unit latch provided in the first address latch unit illustrated in FIG. 6.

Referring to FIG. 8, the unit latch 103c_1 includes MOS transistors T7, T8 and T9 and a latch L2. The MOS transistors T7 and T8 have gates receiving the precharge signal PCG00 and the active signal ACT00, respectively, and are commonly connected to a latch node C. The MOS transistor T9 has a gate receiving a local address signal BAX00. The first address latch unit 130C includes a plurality of unit latches of FIG. 8 arranged in parallel. The unit latches receive the corresponding local address signals BAX0 to BAX7 to output the latched local address signals LAX34<0:3> and LAX56<0:3>, respectively.

Figure 9:
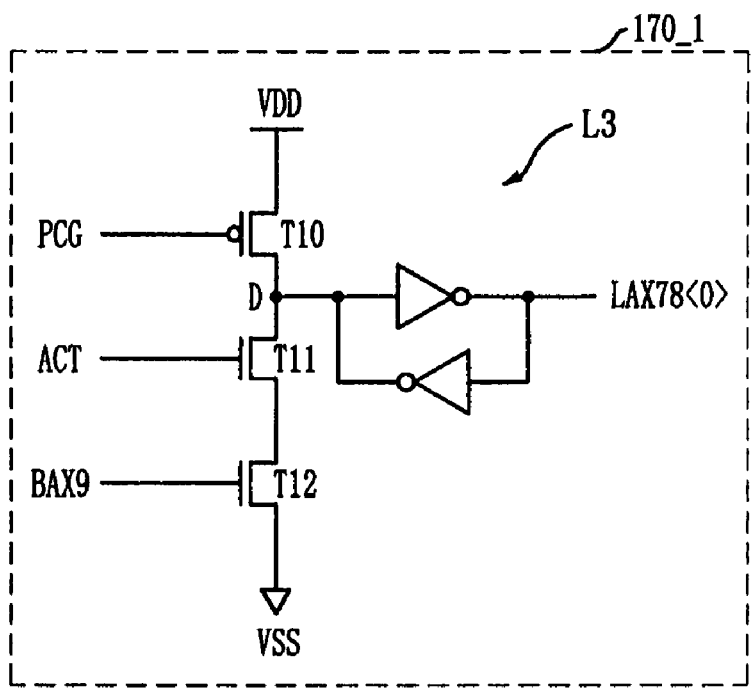
FIG. 9 is a circuit diagram of a unit common latch provided in a common address latch unit illustrated in FIG. 6.

FIG. 9 is a circuit diagram of an unit common latch provided in the common address latch unit illustrated in FIG. 6.

Referring to FIG. 9, the unit common latch 170_1 includes MOS transistors T10, T11 and T12 and a latch L3. The MOS transistors T10 and T11 have gates receiving the common precharge signal PCG and the common active signal ACT, respectively, and are commonly connected to a latch node D. The MOS transistor T12 has a gate receiving a local address signal BAX9. The common address latch unit 170 includes a plurality of unit common latches of FIG. 9 arranged in parallel. The unit common latches receive the corresponding local address signals BAX8 to BAX11 to output the latched local address signals LAX78<0:3>, respectively.

The control signal merging unit 180 merges the active signals ACT00 and ACT01 and the precharge signals PCG00 and PCG01, which are respectively provided from the cell block control units 120C and 120D, and generates the common active signal ACT and the common precharge signal PCG. In order to sequentially activate the cell blocks of one bank, the precharge operation must be performed on the cell block before the cell block is activated. Therefore, the adjacent cell blocks can commonly use the active signal and the precharge signal. The common address latch 170 provides the latched local address signals LAX78<0:3> to the main word line driver units 140C and 140D.

In the semiconductor memory device of FIG. 2, the address latch units 130A and 130B output the latched addresses to the corresponding main word line driver units 140A and 140B. On the other hand, in the semiconductor memory device of the present invention, the common address latch unit outputs the latched addresses to both the main word line driver units 140C and 140D. Therefore, in accordance with the present invention, the latch circuits shown in FIG. 9 can be reduced by the number of the latched addresses that are inputted to both the main word line driver units 140C and 140D.

In the above-described embodiments, the common address latch unit commonly provides the latched local address signal LAX78<0:3> among the latched local address signals LAX34<0:3>, LAX56<0:3> and LAX78<0:3>. However, in some cases, the common address latch unit can also output more bits of the local addresses.

Accordingly, it is possible to more effectively implement the circuit that transfers the received addresses to the word line drivers. That is, it is possible to minimize the circuit area of the address latch units that latch the address to be transferred to the word line drivers for driving the word lines provided in one cell block.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a first word line driver unit for including N unit driving circuits for driving N word lines of a first cell block, the N unit driving circuits being divided into M group driving circuits;
    a second word line driver unit for including N unit driving circuits for driving N word lines of a second cell block, the N unit driving circuits being divided into M group driving circuits;
    a common address latch unit for latching a first address for selecting one of the M group driving circuits included in the first or second word line driver units, respectively, and outputting the latched first address to the first or second word line driver unit;
    a first address latch unit for latching a second address for selecting a unit driving circuit of the selected group driving circuit in the first word line driver unit, and outputting the latched second address to the first word line driver unit; and
    a second address latch unit for latching the second address for selecting a unit driving circuit of the selected group driving circuit in the second word line driver unit, and outputting the latched second address to the second word line driver unit.

2. The semiconductor memory device as recited in claim 1, further comprising:
    a first cell block control unit for activating the first word line driver unit in response to a first select signal; and
    a second cell block control unit for activating the second word line driver unit in response to a second select signal.

3. The semiconductor memory device as recited in claim 1, wherein the first address latch unit includes a plurality of first unit latches configured to be deactivated in response to a first precharge signal and activated in response to a first active signal to latch a signal of a corresponding bit of the second address.

4. The semiconductor memory device as recited in claim 3, wherein the second address latch unit includes a plurality of second unit latches configured to be deactivated in response to a second precharge signal and activated in response to a second active signal to latch a signal of a corresponding bit of the second address.

5. The semiconductor memory device as recited in claim 4, wherein the common address latch unit includes a plurality of unit common latches for latching a signal of a corresponding bit of the first address, the unit common address latches being deactivated in response to a common precharge signal produced by merging the first precharge signal and the second precharge signal and activated in response to a common active signal produced by merging the first active signal and the second active signal.

6. The semiconductor memory device as recited in claim 5, wherein the first unit latch comprises:
    a first MOS transistor configured to provide a power supply voltage to a latch node in response to the first precharge signal;
    a second MOS transistor configured to be turned on in response to the first active signal, one terminal of the second MOS transistor being connected to the latch node;
    a third MOS transistor configured to be turned on in response to a signal of a corresponding bit of the second address, so that the third MOS transistor connects another terminal of the second MOS transistor to a ground terminal; and a first latch connected to the latch node.

7. The semiconductor memory device as recited in claim 6, wherein the unit common address latch comprises:
   a fourth MOS transistor configured to provide the power supply voltage to a common latch node in response to the common precharge signal;
   a fifth MOS transistor configured to turn on in response to the common active signal, one terminal of the fifth MOS transistor being connected to the common latch node;
   a sixth MOS transistor configured to turn on in response to a signal of a corresponding bit of the first address, so that sixth MOS transistor connects another terminal of the fifth MOS transistor to the ground terminal; and
   a second latch connected to the common latch node.

8. The semiconductor memory device as recited in claim 1, wherein the group driving circuit includes:
   the plurality of unit driving circuits arranged in parallel and connected to a common node; and
   a common activating unit for activating the unit driving circuits connected to the common node in response to the latched first address outputted from the common address latch unit.

9. A semiconductor memory device, comprising:
   a word line driver unit for including N unit driving circuits for driving N word lines of a cell block, the N unit driving circuits being divided into M group driving circuits;
   a common address: latch unit for latching a first address for selecting one of the M group driving circuits of the word line driver unit, and outputting the latched first address to the word line driver unit; and
   an address latch unit for latching a second address for selecting a unit driving circuit of the selected group driving circuit in the word line driver unit, and outputting a latched second address to the word line driver unit.

10. The semiconductor memory device as recited in claim 9, further comprising a cell block control unit for activating the word line driver unit in response to a select signal for selecting the word line driver unit.

11. The semiconductor memory device as recited in claim 9, wherein the address latch unit includes a plurality of unit latches configured to be deactivated in response to a precharge signal and activated in response to an active signal to latch a signal of a corresponding bit of the second address.

12. The semiconductor memory device as recited in claim 11, wherein the unit latch includes:
   a first MOS transistor configured to provide a power supply voltage to a latch node in response to the precharge signal;
   a second MOS transistor configured to turn on in response to the active signal, one terminal of the second MOS transistor being connected to the latch node;
   a third MOS transistor configured to turn on in response to a signal of a corresponding bit of the second address, so that the third MOS transistor connects another terminal of the second MOS transistor to a ground terminal; and
   a latch connected to the latch node.

13. The semiconductor memory device as recited in claim 12, wherein the group driving circuit of the word line driver unit includes:
   a plurality of the unit driving circuits arranged in parallel and connected to a common node; and
   a common activating unit for activating the unit driving circuits connected to the common node in response to the latched first address outputted from the common address latch unit.

* * * * *